United States Patent [19]
Chang et al.

[11] Patent Number: 6,074,931
[45] Date of Patent: Jun. 13, 2000

[54] PROCESS FOR RECESS-FREE PLANARIZATION OF SHALLOW TRENCH ISOLATION

[75] Inventors: Jung-Ho Chang, Uen-Lin; Hsi-Chuan Chen, Tainan; Dahcheng Lin, Hsinchu, all of Taiwan

[73] Assignee: Vanguard International Semiconductor Corporation, Hsin-Chu, Taiwan

[21] Appl. No.: 09/187,302

[22] Filed: Nov. 5, 1998

[51] Int. Cl.[7] .......................... H01L 21/76; H01L 21/302; H01L 21/311
[52] U.S. Cl. .......................... 438/424; 438/692; 438/700
[58] Field of Search .................... 438/424, 692, 438/700, FOR 221, FOR 222

[56] References Cited

U.S. PATENT DOCUMENTS

| | | | |
|---|---|---|---|
| 4,876,217 | 10/1989 | Zdebel | 437/67 |
| 4,994,406 | 2/1991 | Vasquez et al. | 437/67 |
| 5,190,889 | 3/1993 | Poon et al. | 437/67 |
| 5,258,332 | 11/1993 | Horioka et al. | 437/228 |
| 5,433,794 | 7/1995 | Fazan et al. | 148/33.3 |
| 5,578,518 | 11/1996 | Koike et al. | 437/67 |
| 5,674,775 | 10/1997 | Ho et al. | 437/67 |
| 5,868,870 | 2/1999 | Fazan et al. | |
| 5,880,004 | 3/1999 | Ho | |
| 5,940,716 | 8/1999 | Jin et al. | |

*Primary Examiner*—John F. Niebling
*Assistant Examiner*—Josetta Jones
*Attorney, Agent, or Firm*—George O. Saile; Stephen B. Ackerman

[57] ABSTRACT

An improved and new process for fabricating planarized isolation trenches, wherein sharp corners at the top periphery of the trench are eliminated and erosion of insulating material at the edges of isolation trenches is suppressed, has been developed. The process uses a two layer mask to etch the isolation trench, followed by an isotropic etch to recess the first layer of the mask. An oxide liner is formed in the trench and across the exposed edge of the trench resulting in rounding the corners of the trench. Then, a second isotropic etch is used to recess the edge of the second mask layer, so that its opening now is beyond the edge of the trench. An oxide layer is conformally deposited over all exposed surfaces and fills the trench. After CMP to planarize the oxide layer, the remaining oxide fills the trench and, also, extends a small distance beyond the edge of the trench and serves to protect edge of the trench during subsequent etching.

23 Claims, 3 Drawing Sheets

PROCESS FOR RECESS-FREE PLANARIZATION OF SHALLOW TRENCH ISOLATION

BACKGROUND OF THE INVENTION (1) Field of the Invention

This invention relates to a method of fabrication used to form isolation regions in semiconductor devices and particularly to a method to form shallow trenches for isolation regions in semiconductor devices and more specifically to a method to form shallow trench isolation (STI).

(2) Description of Related Art

As semiconductor integrated circuits progress toward greater micro-miniaturation active devices are packed into ever smaller areas and electrical isolation between active devices becomes an extremely important issue. Shallow trenches filled with insulating material have proven to be most desirable for isolating active devices. However, the trench isolation process still suffers from a problem of sub-threshold "double-hump" in I–V characteristics caused by sharp corners at the top periphery of the isolation trench. In addition, trench isolation processes also suffer from a problem of eroded insulating material at trench edges after conventional shallow trench isolation processing. This erosion of insulating material produces "divots" at the edges of the trench and, also, worsens the abnormal device characteristics, such as the "double hump" in I–V curves, and, additionally makes subsequent gate etching more difficult. Therefore, a challenge in the industry is to provide a means of formation of planarized isolation trenches having rounded corners at the top periphery of the trenches and without the formation of "divots" at the edges of the trenches.

Numerous improvements to methods of forming planarized isolation trenches have been invented. For example, U.S. Pat. No. 5,578,518 entitled "Method of Manufacturing a Trench Isolation Having Round Corners" granted Nov. 26, 1996 to Hidetoshi Koike et al describes a method of forming shallow trench isolation which produces rounded corners on the STI.

Also, U.S. Pat. No. 5,258,332 entitled "Method of Manufacturing Semiconductor Devices Including Rounding of Corner Portions by Etching" granted Nov. 2, 1993 to Keiji Horioka et al shows methods of forming rounded STI corners using plasma etching in gas mixtures including fluorine and oxygen.

U.S. Pat. No. 5,674,775 entitled "Isolation Trench With a Rounded Top Edge Using an Etch Buffer Layer" granted Oct. 7, 1997 to Chin-Hsiung Ho et al shows a method of forming STI with rounded corners using a sacrificial spacer during etching of the trench.

U.S. Pat. No. 5,433,794 entitled "Spacers Used To Form Isolation Trenches With Improved Corners" granted Jul. 18, 1995 to Pierre C. Fazan et al describes a method of forming trench isolation in which the isolating material extends over the peripheral edge of the trench, thereby creating a small rounded cap over the trench.

U.S. Pat. No. 4,876,217 entitled "Method of Forming Semiconductor Structure Isolation Regions" granted Oct. 24, 1989 to Peter J. Zdebel describes a method of forming dielectric isolation regions in a semiconductor substrate, whereby a trench is etched in the semiconductor substrate, the trench is lined with a first dielectric layer, then filled with a second dielectric layer, followed by masking and removal of the second dielectric layer outside the trench region.

U.S. Pat. No. 5,190,889 entitled "Method of Forming Trench Isolation Structure With Germanium Silicate Filling" granted Mar. 2, 1993 to Stephen S. Poon et al describes a method of forming rounded trenches. The method uses a barrier layer liner in the trench and a germanium silicate filling material.

U.S. Pat. No. 4,994,406 entitled "Method of Fabricating Semiconductor Devices Having Deep and Shallow Isolation Structures" granted Feb. 19, 1991 to Barbara Vasquez shows a method of forming isolation structures in semiconductor substrates whereby both deep trench isolation elements and shallow dielectric isolation elements may be fabricated at variable widths.

The present invention is directed to a novel method of fabricating planarized isolation trenches, wherein sharp corners at the top periphery of the trench are eliminated and erosion of insulating material at the edges of isolation trenches is suppressed,

SUMMARY OF THE INVENTION

It is a general object of the present invention to provide an improved method of forming planarized isolation trenches for use in semiconductor integrated circuits.

A more specific object of the present invention is to provide an improved method of forming planarized isolation trenches for use in semiconductor integrated circuits, wherein sharp corners at the top periphery of the trench are eliminated.

Another object of the present invention is to provide an improved method of forming planarized isolation trenches for use in semiconductor integrated circuits, wherein erosion of insulating material at the edges of isolation trenches is suppressed.

In accordance with the present invention, the above and other objectives are realized by using a method of forming a trench isolation region in a surface of a semiconductor substrate for the purpose of isolating active device areas, the method comprising the steps of: providing the semiconductor substrate containing active devices; forming a first oxide layer on the surface of the semiconductor substrate; forming a silicon nitride layer on the first oxide layer; removing portions of the silicon nitride layer and the first oxide layer to form an opening in the silicon nitride layer and the first oxide layer to expose a selected portion of the surface of the semiconductor substrate; etching the semiconductor substrate through the opening to form a trench in the semiconductor substrate; subjecting the first oxide layer to side etching through the openings to form a recess in the first oxide layer and, also, forming an exposed edge of the semiconductor substrate at the boundary with the trench; forming a second oxide layer over all exposed silicon surfaces including the inside of the trench and exposed edge of the semiconductor substrate at the boundary with the trench; subjecting the silicon nitride layer to isotropic etching which decreases the thickness of the silicon nitride layer and recesses the edge of the silicon nitride layer at the opening in the silicon nitride layer; forming a third oxide layer over all exposed surfaces, filling the trench in the semiconductor substrate with the third oxide layer; removing by CMP the third oxide layer, stopping in the silicon nitride layer, to leave a portion of the third oxide layer only in the trench, and to form a substantially planar surface between the remaining silicon nitride layer and the remaining third oxide layer; removing by etching the remaining silicon nitride layer; and removing the remaining first oxide layer on the surface of the semiconductor substrate, thereby forming a planarized oxide filled trench.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of forming planarized isolation trenches for use in semiconductor integrated circuits will now be described in detail.

Referring to FIGS. 1A–1H, semiconductor substrate 10 contains active devices (not shown). Semiconductor substrate 10 is preferably single crystal silicon, but may be any semiconductor material, such as silicon or germanium or silicon or gallium arsenide used in the fabrication of integrated circuits. Layer 11 comprises silicon oxide having a thickness between about 50 and 500 Angstroms. Layer 12 comprises silicon nitride having a thickness between about 1000 and 3000 Angstroms. Layers 11 and 12 are patterned with a window 13 defining the region where the isolation trench is to be formed.

Figure 1A:
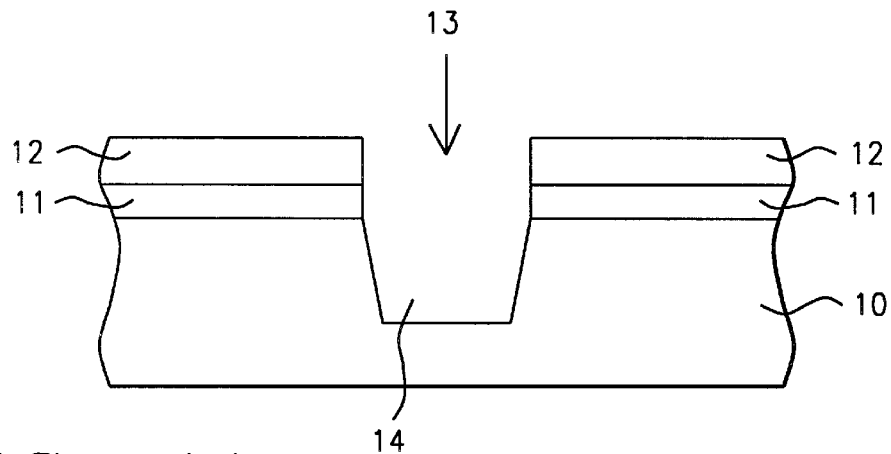
FIGS. 1A–1H, which schematically, in cross-sectional representation illustrate the method of one embodiment of the present invention.
Figure 1B:
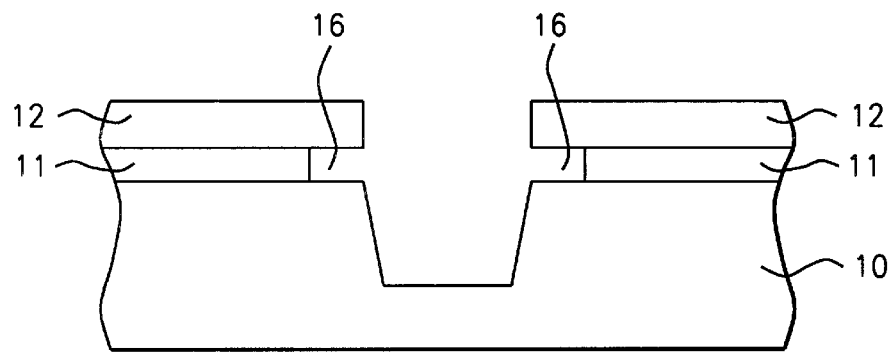

FIG. 1A shows trench 14 etched into semiconductor substrate 10. Next, as shown in FIG. 1B, silicon oxide layer 11 is subjected to side etching through the opening in layers 12 and 11. An isotropic etch such as buffered or dilute hydrofluoric acid in $H_2O$ is used. This etch has high selectivity for etching silicon oxide preferentially over silicon nitride. Typically the etch rate ratio for silicon oxide to silicon nitride is between about 20 and 500. This etch, also, has a high selectivity for etching silicon oxide preferentially over silicon. Typically the etch rate ratio for silicon oxide to silicon is between about 20 and 1000. The side etching of silicon oxide layer 11 undercuts silicon nitride layer 12 forming a recess 16 in silicon oxide layer 11. The recess 16 extends beyond the edge of the etched trench for a distance between about 30 and 300 Angstroms. During the side etching of silicon oxide layer 11 slight rounding of the top corner of the trench etched into the silicon substrate occurs.

Figure 1C:
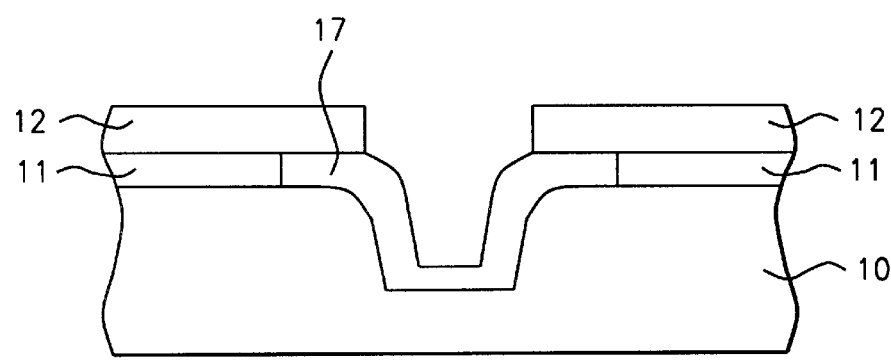

Referring to FIG. 1C, a second oxide layer 17 is formed over all exposed silicon surfaces including the inside of the trench and exposed edge of the semiconductor substrate at the boundary with the trench. Formation of second oxide layer 17 produces an oxide liner within the etched trench and across the top corner (now rounded) of the trench. The second oxide layer 17 abuts the first oxide layer 11, as shown in FIG. 1C. The second oxide layer 17 is formed by thermal oxidation in an oxygen-steam ambient, at a temperature between about 800° and 1000° C., to a thickness between about 50 and 500 Angstroms. The corner of the trench is rounded during the formation of the second oxide layer 17 because of the faster oxidation rate at the corner, so-called two dimensional effect, when oxidation occurs at the recess 16 and at the trench 14.

Figure 1D:
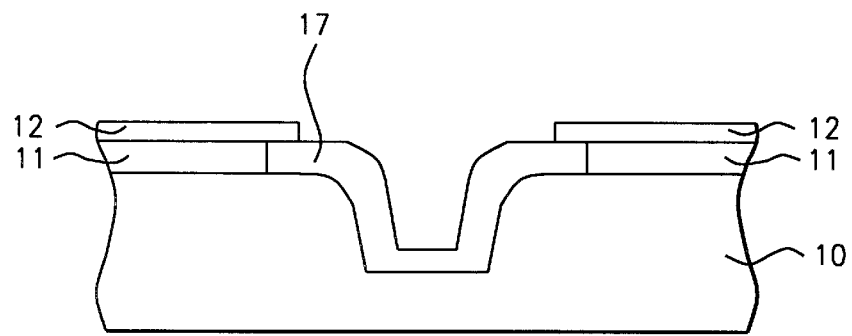

Referring to FIG. 1D, an isotropic etch which selectively etches silicon nitride preferentially to silicon oxide is used to recess the edge of the opening in the silicon nitride layer 12. An isotropic etch such as hot phosphoric acid is used. Typically the etch rate ratio for silicon nitride to silicon oxide is between about 20 and 100. It is desirable that the edge of the opening in silicon nitride layer 12 be recessed between about 200 and 600 Angstroms. At the same time the thickness of silicon nitride layer 12 is reduced by between about 200 and 600 Angstroms, as shown in FIG. 1D.

Figure 1E:
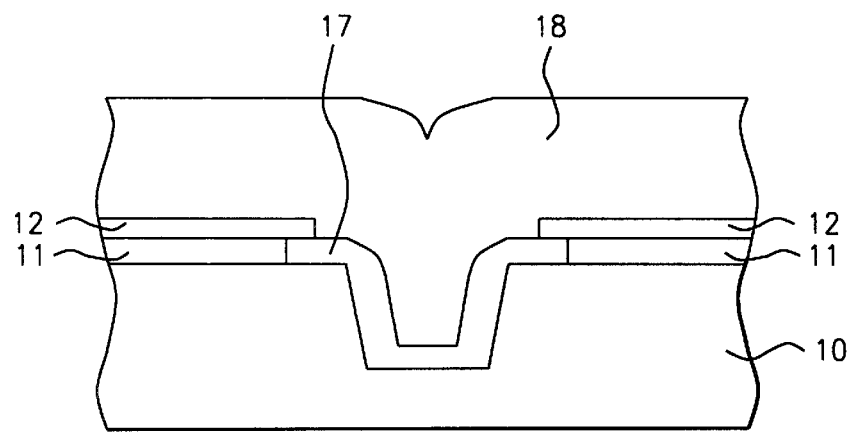

Now referring to FIG. 1E, third oxide layer 18 is formed over all exposed surfaces, filling the trench in the semiconductor substrate. Third oxide layer 18 may be silicon oxide deposited conformally by LPCVD (Low Pressure Chemical Vapor Deposition) or PECVD (Plasma Enhanced Chemical Vapor Deposition) processes to a thickness between about 2000 and 10,000 Angstroms.

Figure 1F:
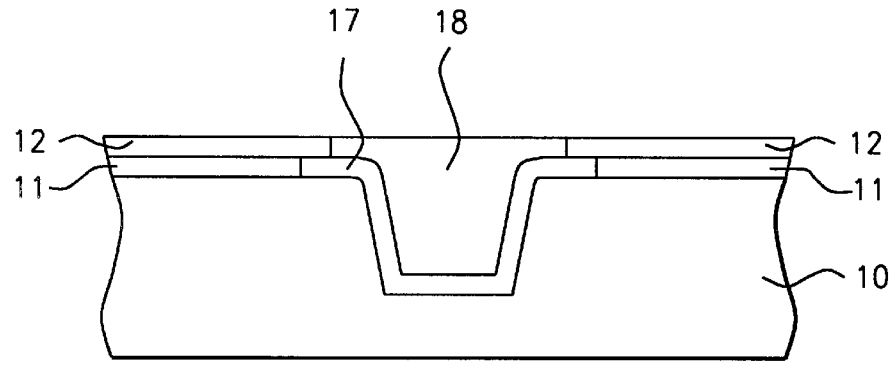

Next, CMP (Chemical Mechanical Polishing) is used to planarize and remove the third oxide layer, stopping in the silicon nitride layer, to leave a portion of the third oxide layer only in the trench, and to form a substantially planar surface between the remaining silicon nitride layer and the remaining third oxide layer, as shown in FIG. 1F. After CMP the remaining third oxide fills the trench and, also, extends a distance of between about 200 and 600 Angstroms beyond the edge of the trench, as shown in FIG. 1F. This extension will serve to protect edge of the trench during subsequent etching.

Figure 1G:
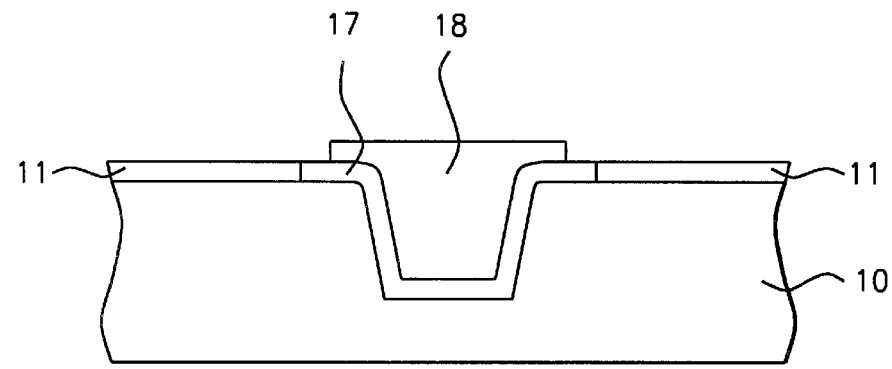
Figure 1H:
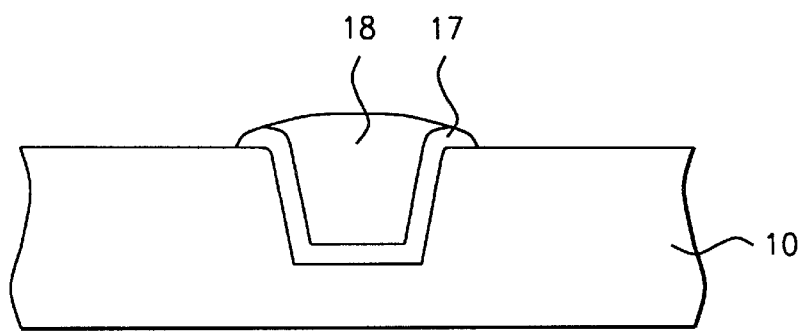

Referring to FIGS. 1G and 1H, the remaining silicon nitride layer is removed by etching in a hot phosphoric acid solution, followed by etching of the first oxide layer 11 in a buffered or dilute hydrofluoric acid solution in $H_2O$. During etching to remove oxide layer 11 the edges of the trench are protected by the third oxide layer 18 remaining in the trench and extending beyond the edge of the trench for a distance between about 200 and 600 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of forming a trench isolation region in a surface of a semiconductor substrate for the purpose of isolating active device areas, the method comprising the steps of:

providing said semiconductor substrate containing active devices;

forming a first oxide layer on the surface of said semiconductor substrate;

forming a silicon nitride layer on said first oxide layer;

removing portions of said silicon nitride layer and said first oxide layer to form an opening in said silicon nitride layer and said first oxide layer to expose a selected portion of the surface of said semiconductor substrate;

etching said semiconductor substrate through said opening to form a trench in said semiconductor substrate;

subjecting said first oxide layer to side etching through said openings to form a recess in said first oxide layer and, also, forming an exposed edge of said semiconductor substrate at the boundary with said trench;

forming a second oxide layer over all exposed silicon surfaces including the inside of the trench and exposed edge of said semiconductor substrate at said boundary with said trench;

subjecting said silicon nitride layer to isotropic etching which decreases the thickness of said silicon nitride layer and recesses the edge of the silicon nitride layer at said opening in said silicon nitride layer;

forming a third oxide layer over all exposed surfaces, filling said trench in said semiconductor substrate;

removing by CMP said third oxide layer, stopping in said silicon nitride layer, to leave a portion of said third oxide layer only in said trench, and to form a substantially planar surface between the remaining silicon nitride layer and the remaining third oxide layer;

removing by etching the remaining silicon nitride layer; and removing the remaining first oxide layer on the surface of said semiconductor substrate, thereby forming a planarized oxide filled trench.

2. The method of claim 1, wherein said semiconductor substrate is silicon.

3. The method of claim 1, wherein said first oxide layer is silicon oxide formed by thermal oxidation in an oxygen-steam ambient, at a temperature between about 800° and 1000° C., to a thickness between about 50 and 500 Angstroms.

4. The method of claim 1, wherein said silicon nitride layer is formed by LPCVD or PECVD processes to a thickness between about 1000 and 3000 Angstroms.

5. The method of claim 1, wherein said side etching of said first oxide layer is performed using a buffered or dilute hydrofluoric acid solution in $H_2O$.

6. The method of claim 5, wherein said side etching of said first oxide layer recesses the edge of said first oxide a distance between about 30 and 300 Angstroms beyond the edge of said trench.

7. The method of claim 1, wherein said second oxide layer is formed by thermal oxidation in an oxygen-steam ambient, at a temperature between about 800° and 1000° C., to a thickness between about 100 and 500 Angstroms.

8. The method of claim 1, wherein said isotropic etching of said silicon nitride layer is performed using a hot phosphoric acid solution.

9. The method claim 8, wherein said isotropic etching of said silicon nitride layer recesses the edge of said silicon nitride layer a distance between about 200 and 600 Angstroms.

10. The method of claim 1, wherein said third oxide layer is silicon oxide deposited conformally by LPCVD or PECVD processes to a thickness between about 2000 and 10,000 Angstroms.

11. The method of claim 1, wherein said etching of the remaining silicon nitride layer is performed using hot phosphoric acid.

12. The method of claim 1, wherein removing the remaining first oxide layer on the surface of said semiconductor substrate is by etching using a buffered or dilute hydrofluoric acid solution in $H_2O$.

13. A method of forming a trench isolation region in a surface of a silicon substrate for the purpose of isolating active device areas, the method comprising the steps of:

providing said silicon substrate containing active devices;

forming a first oxide layer on the surface of said silicon substrate;

forming a silicon nitride layer on said first oxide layer;

removing portions of said silicon nitride layer and said first oxide layer to form an opening in said silicon nitride layer and said first oxide layer to expose a selected portion of the surface of said silicon substrate;

etching said silicon substrate through said opening to form a trench in said silicon substrate;

subjecting said first oxide layer to side etching through said openings to form a recess in said first oxide layer and, also, forming an exposed edge of said silicon substrate at the boundary with said trench;

forming a second oxide layer over all exposed silicon surfaces including the inside of the trench and exposed edge of said silicon substrate at said boundary with said trench;

subjecting said silicon nitride layer to isotropic etching which decreases the thickness of said silicon nitride layer and recesses the edge of the silicon nitride layer at said opening in said silicon nitride layer;

forming a third oxide layer over all exposed surfaces, filling said trench in said silicon substrate;

removing by CMP said third oxide layer, stopping in said silicon nitride layer, to leave a portion of said third oxide layer only in said trench, and to form a substantially planar surface between the remaining silicon nitride layer and the remaining third oxide layer;

removing by etching the remaining silicon nitride layer; and removing the remaining first oxide layer on the surface of said silicon substrate, thereby forming a planarized oxide filled trench.

14. The method of claim 13, wherein said first oxide layer is silicon oxide formed by thermal oxidation in an oxygen-steam ambient, at a temperature between about 800° and 1000° C., to a thickness between about 50 and 500 Angstroms.

15. The method of claim 13, wherein said silicon nitride layer is formed by LPCVD or PECVD processes to a thickness between about 1000 and 3000 Angstroms.

16. The method of claim 13, wherein said side etching of said first oxide layer is performed using a buffered or dilute hydrofluoric acid solution in $H_2O$.

17. The method of claim 16, wherein said side etching of said first oxide layer recesses the edge of said first oxide a distance between about 30 and 300 Angstroms beyond the edge of said trench.

18. The method of claim 13, wherein said second oxide layer is formed by thermal oxidation in an oxygen-steam ambient, at a temperature between about 800° and 1000° C., to a thickness between about 100 and 500 Angstroms.

19. The method of claim 13, wherein said isotropic etching of said silicon nitride layer is performed using hot phosphoric acid.

20. The method claim 19, wherein said isotropic etching of said silicon nitride layer recesses the edge of said silicon nitride layer a distance between about 200 and 600 Angstroms.

21. The method of claim 13, wherein said third oxide layer is silicon oxide deposited conformally by LPCVD or PECVD processes to a thickness between about 2000 and 10,000 Angstroms.

22. The method of claim 13, wherein said etching of the remaining silicon nitride layer is performed using hot phosphoric acid.

23. The method of claim 13, wherein removing the remaining first oxide layer on the surface of said semiconductor substrate is by etching using a buffered or dilute hydrofluoric acid solution in $H_2O$.

* * * * *